US007987405B2

(12) United States Patent
Turner et al.

(10) Patent No.: US 7,987,405 B2
(45) Date of Patent: Jul. 26, 2011

(54) METHOD AND SYSTEM FOR CALCULATING AND VERIFYING THE INTEGRITY OF DATA IN A DATA TRANSMISSION SYSTEM

(75) Inventors: Christopher Gordon Gervase Turner, Oakley (GB); John McMurray, Gaueng (ZA)

(73) Assignee: ZIH Corp., Hamilton (BM)

( * ) Notice: Subject to any disclaimer, the term of this patent is extended or adjusted under 35 U.S.C. 154(b) by 712 days.

(21) Appl. No.: 10/597,194

(22) PCT Filed: Jan. 14, 2005

(86) PCT No.: PCT/GB2005/000110
§ 371 (c)(1),
(2), (4) Date: Oct. 16, 2008

(87) PCT Pub. No.: WO2005/069525
PCT Pub. Date: Jul. 28, 2005

(65) Prior Publication Data
US 2009/0217144 A1  Aug. 27, 2009

(30) Foreign Application Priority Data
Jan. 16, 2004 (GB) .................................. 0400968.4

(51) Int. Cl.
H03M 13/00 (2006.01)
(52) U.S. Cl. ...................... 714/758; 714/752; 340/10.31
(58) Field of Classification Search .................. 714/752, 714/758; 340/10.1–10.5
See application file for complete search history.

(56) References Cited

U.S. PATENT DOCUMENTS

| 5,365,551 | A | 11/1994 | Snodgrass et al. | |
| 6,674,359 | B1* | 1/2004 | Aslanidis et al. | 340/10.31 |
| 6,725,014 | B1* | 4/2004 | Voegele | 455/41.2 |
| 7,239,657 | B1* | 7/2007 | Gunnarsson | 375/133 |

FOREIGN PATENT DOCUMENTS

| EP | 1093075 A1 | 4/2001 |
| WO | WO0213393 A2 | 2/2002 |

OTHER PUBLICATIONS

International Search Report for International ApplicationNo. PCT/GB2005/000110, completed on Apr. 26, 2005.

* cited by examiner

Primary Examiner — Sam Rizk
(74) Attorney, Agent, or Firm — Alston & Bird LLP

(57) ABSTRACT

A method is described of calculating and verifying the integrity of data in a data communication system. The system comprises a base station and one or more remote stations, such as in an RFID system. The method includes transmitting a select instruction from the base station to the one or more remote stations, the select instruction containing a data field which matches a portion of an identity or other data field in one or more of the remote stations; transmitting from a selected remote station or stations a truncated reply containing identity data or other data of the remote station but omitting the portion transmitted by the base station; calculating in the base station a check sum or CRC from the data field originally sent and the truncated reply data received and comparing the calculated check sum or CRC with the check sum or CRC sent by the remote station.

41 Claims, 4 Drawing Sheets

Fig.2.

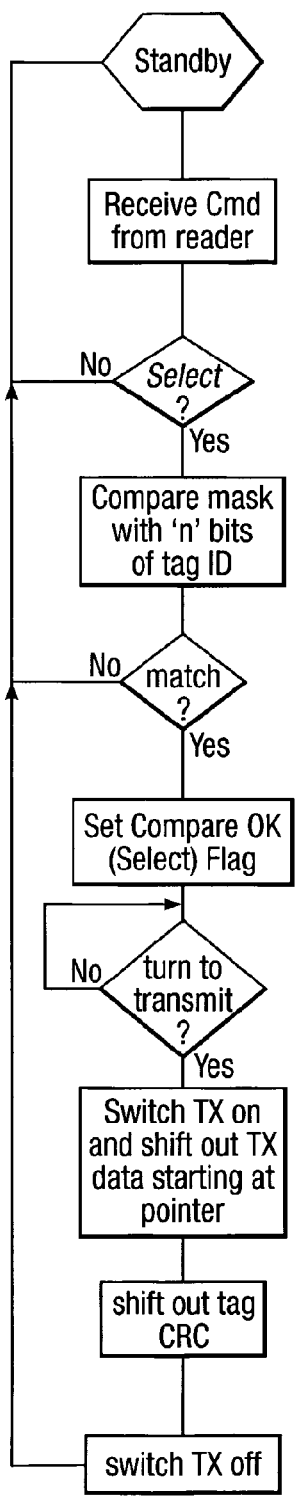

Is the command a 'select' command containing a mask parameter?

The tag clocks its TX shift register together with the incoming mask data and performs a bit by bit comparison of the tag ID and the mask for 'n' bits as determined by the mask length. Simultaneously the ID is shifted through the tag CRC generator The reader calculates the first portion of the CRC based on the mask value transmitted to the tag in the select command.

If the mask and 'n' bits of the tag ID match then the tag sets its Selected flag and waits for its turn to transmit as determined by the system arbitration algorithm. A pointer indicates the position of the next bit in the tag memory following the last bit compared. The CRC generator retains its current value.

When it is the tag's turn to transmit it starts its transmission from the bit position indicated by the pointer. The ID is simultaneously shifted through the CRC generator, the CRC generator continues from its last position without resetting.

As the reader receives the tag transmission it continues from where it left off, calculating the CRC on the incoming message When the last ID bit is shifted out of tag memory the tag switches to shifting out the CRC bits. When the last CRC bit has been shifted out the TX switches off completing the reply cycle. The CRC is calculated over the complete tag ID stored in memory even though only a portion of the ID was actually transmitted.

Once the reader has received the the last message bit from the tag it compares the CRC transmitted by the tag with the CRC generated in the reader from the mask value transmitted by it and the data stream received from the tag.

METHOD AND SYSTEM FOR CALCULATING AND VERIFYING THE INTEGRITY OF DATA IN A DATA TRANSMISSION SYSTEM

The present invention relates to a method and system for calculating and verifying the integrity of data in a data transmission system and more particularly, but not exclusively, to data transmission systems over radio between a base station and one or more mobile or remote stations such as (but not limited to) those used in Radio Frequency Identification (RFID) Systems. The invention also provides a transponder or tag to implement the method.

BACKGROUND

A Radio Frequency Identification System is usually comprised of an interrogator (base station) commonly referred to as a reader or scanner and one or more transponders (mobile stations) usually called tags or electronic labels.

In systems of known art, the reader issues a request or command for any tags within range to reply with their identity or their stored data. In a variant, tags on detecting the presence of a reader will send their identity or stored data. The identity or stored data is transmitted by the tag using either a self-contained transmitter or by means of modulated backscatter as bursts of data within messages or packets. A message may contain either a portion or all of the identity or stored data.

The transmission from the tag in the form of identity or data will often have a checksum or cyclic redundancy code (CRC) appended to the identity or data, this checksum or CRC being used by the reader to test for the correctness of the data received by it from the tag.

Where multiple tags are present in the reader field it is important that tag transmissions and the length of messages be kept to the minimum necessary to convey identity or data content of the tags being read by the reader. This is achieved by using deliberate truncation of the tag message transmissions where the reader knows a portion of the tags' identities or data content.

Referring to FIG. 1, one method is for the reader to issue a Select instruction to the tag population present. The Select instruction contains a data field, shown in FIG. 1 as having S bits, that matches a portion of the data field in the tag identity, the tag identity having D bits. Tags whose identity have a matching portion respond by transmitting a shortened reply containing their identity omitting the portion previously transmitted by the reader, shown as N bits equal to D-S bits. A checksum or CRC, usually, but not necessarily, consisting of 16 bits, is shown appended to the N bits to define a "truncated message" or "truncated reply".

Now referring to the checksum or CRC; this may be either generated in real time by the tag when the tag transmits its message, alternatively it may be calculated when the data is written to the tag and stored in the tag, in which case it refers to the full tag identity or stored data. When the tag transmits its full identity or stored data, the reader will not know necessarily whether the checksum or CRC was calculated by the tag at the time of transmission or whether it was previously stored in the tag.

However, if the tag transmits only a portion of its identity or stored data, for example in response to a request by the reader for it to send a "truncated reply", in the case of a generated [in real time] checksum or CRC it will be based only on the portion of the identity or stored data actually transmitted, whereas in the case of the pre-calculated and stored checksum or CRC it will be based on the full identity or stored data. Therefore in the latter case, when the reader tests the received message for correctness using the stored checksum or CRC, it will not compute correctly and will discard the message as being in error.

This invention strives to overcome the problem described above.

SUMMARY OF THE INVENTION

In one aspect of the invention, there is provided a method of calculating and verifying the integrity of data in a data communication system comprising a base station and one or more remote stations, the method including transmitting a select instruction from the base station to said one or more remote stations, the select instruction containing a data field which matches a portion of an identity or other data field in one or more of the remote stations; transmitting from a selected remote station or stations a truncated reply containing identity data or other data of the remote station but omitting the portion transmitted by the base station; calculating in the base station a check sum or CRC from the data field originally sent and the truncated reply data received and comparing the calculated check sum or CRC with the check sum or CRC sent by the remote station.

The calculation in the base station of a check sum or CRC may be based from the same section or sections of the full data message used by the remote station to calculate the CRC sent with the data transmitted, this being the data field originally sent, and the truncated reply data received and comparing the calculated check sum or CRC with the check sum or CRC sent by the remote station.

In one embodiment the base station is a reader or interrogator and the remote station or stations are RFID transponders.

The remote station typically transmits its check sum or CRC as data either preceding or appended to its identity or other data in its truncated reply. In response to a select instruction or instructions from the base station the remote station clocks data corresponding to that in the select instruction through a checksum generator, the data in the truncated reply also being clocked through the checksum generator to derive a checksum which is clocked out preceding or appended to the truncated reply data.

In one embodiment the base station begins calculating the anticipated checksum or CRC of the remote station or stations during a period preceding the receipt of the truncated reply, to derive a partial checksum calculation based on the data field in the select information, the partial checksum calculation being temporarily saved for use when the truncated reply is received. The base station may begin calculating the partial checksum during the transmission of the select information, and the truncated reply from the remote station is clocked through a checksum generator to continue calculating the checksum, beginning from the saved partial checksum, whereby upon receiving the last bit from the truncated reply, the final checksum calculated in the base station can be compared with that sent by the remote station.

In one embodiment the base station resets the checksum calculation logic and pre-loads the partially calculated checksum previously saved, ready to receive the truncated reply from another selected remote station. Alternatively, having received the truncated reply from a remote station, the base station recalculates the data in the select information following successful reception and decoding of each truncated reply, for calculating together with the data in the truncated reply the checksum or CRC, and continuing this process until the base station transmits a new select information request to the remote stations.

In a preferred embodiment the method includes sending a command from the reader to a tag command decoder for decoding the command, shifting data in the tag memory to a tag shift register in synchronism with incoming mask data from the reader to a comparator, performing a bit by bit comparison between the mask data and the tag memory data at the comparator, and calculating a checksum or CRC at a checksum or CRC generator within the tag.

Conveniently the input data from the reader and the output data from the tag shift register are presented to respective inputs of a logic circuit, and in one embodiment the method includes setting within the tag a Compare OK or Select flag, which serves to enable the tag to take part in an arbitration cycle, when the tag data and the mask value match.

In one embodiment when the tag is receiving the mask and performing the comparison with the internal memory data, the method also includes the step of shifting the internal data through the checksum or CRC generator, this being the same CRC generator used to generate the tag CRC. Once the Select flag has been set the tag stops shifting any further data through the transmit shift register and also no further data is shifted through the CRC generator, the CRC generator freezes and retains its current state.

Conveniently a pointer in the tag marks the position where the comparison ended, and the tag participating in the arbitration sequence as determined by the arbitration algorithm implemented, and by command from the reader (sending arbitration commands), switches on its Transmitter, and begins to shift out the tag ID data, starting from bit position following the point where the comparison with the mask ended.

In another aspect of the invention, there is provided a system for calculating and verifying the integrity of data in a data communication system comprising a base station and one or more remote stations, the system comprising base station transmitting circuitry for transmitting select instructions from the base station to said one or more remote stations, the select instruction containing a data field which matches a portion or portions of an identity or other data field in one or more of the remote stations; remote station transmitting circuitry for transmitting from a selected remote station or stations a truncated reply containing identity data or other data of the remote station but omitting the portion transmitted by the base station; calculating means for calculating in the base station a check sum or CRC from the data field originally sent and the truncated reply data received and a comparator for comparing the calculated check sum or CRC with the check sum or CRC sent by the remote station.

The base station is in one embodiment a reader or interrogator and the remote station or stations are RFID transponders. This invention therefore provides a method and system for a reader to correctly validate a tag transmission in a communications system when the tag transmission is truncated; that is only a portion of the tag's identity is transmitted. This invention is particularly useful in those cases where a checksum or CRC for the identity or data is stored in the tag.

For the purposes of this description the term checksum shall apply to CRCs or other form of error checking.

The invention also provides a means for a tag to reply to a reader request in a shortened or truncated form whilst still being able to provide the reader with a full error checking capability as if the entire message had been transmitted whether the checksum is calculated and stored on the tag when the tag is programmed or whether the checksum is generated 'on the fly' by the tag at the time of the tag sending a reply. This is particularly important when the tag is to contain user written data, where this data can be changed by the user. If the checksum were pre-calculated, and stored on the tag and user data subsequently changed the CRC would be incorrect. This would mean that the CRC could not be protected as it would have to be re-written each time that a user modified the data content. This invention therefore allows a portion of the tag data such as the ID to be locked and protected whilst giving users the freedom to change their data and yet still providing a valid and flexible CRC for over the air communications error checking whilst also retaining the flexibility of truncated messaging.

Another aspect of the invention is transponder or tag for use in an RFID system with a reader or interrogator, comprising a command decoder for decoding the command from the reader, a shift register for shifting data in the tag memory in synchronism with incoming mask data from the reader to a comparator, the comparator performing a bit by bit comparison between the mask data and the tag memory data, and a checksum or CRC generator.

There are several possible implementations of the checksum or CRC calculation which all rely on the same principle For example, in the embodiment described above, the CRC is calculated on the tag over the full stored data (message) even though a truncated message is transmitted. In this case the reader calculates the CRC on that portion of the data sent as the selection criterion combined with that portion of the data in the tag reply. The selection mask is described above as corresponding to a sequence of bits from the START of data in the relevant tag data field. In alternative embodiments the selection mask data may be from the MIDDLE of data in the tag or END of data in the tag. In other words the selection does not necessarily need to start at the most significant bit of the tag stored data. It may also refer to several unconnected fields with the tag data memory.

In another implementation, the tag contains a stored CRC calculated over the full data message which message is then truncated when it is sent. The reader calculates the crc on that portion of the data sent as the select criterion [mask] combined with that portion of the data sent by the tag. Selection mask may be from START of data in tag, MIDDLE of data in tag or END of data in tag. As described above the selection does not necessarily need to start at the most significant bit of the tag stored data.

In a further implementation, the tag may contain multiple stored CRCs for multiple data fields, each data field having its own CRC. In this case truncation may occur on boundaries, each boundary associated with one stored CRC (plus one for the full tag data). Selection of the CRC and determination of the boundaries can be done on the tag or by a specific reader command or instruction to the tag. Selection may be equal to the field size of each data field or may be longer covering multiple data fields.

In yet a further embodiment the CRC is based on the transmitted [truncated] portion of the tag message, this is used when the reader calculates and uses only that portion of the data sent by the tag ignoring the unsent part.

In another aspect of the invention, there is provided a method of calculating and verifying the integrity of data in a data communication system comprising one or more base stations and one or more remote stations, the method including transmitting a select instruction from the remote station to said one or more remote base stations, the select instruction containing a data field which matches a portion of an identity or other data field in one or more of the remote base stations; transmitting from a selected bases station or stations a truncated reply containing identity data or other data of the base station but omitting the portion transmitted by the remote station and calculating in the remote station a check sum or CRC from the data the truncated reply data received.

In a further aspect of the invention there is provided a reader or interrogator for use in a system with one or more remote stations, the reader including a transmitter arranged to transmit one or more select instructions to said one or more remote stations, the select instruction or instructions containing a data field which matches a portion of an identity or other data field in one or more of the remote stations; a receiver arranged to receive a truncated reply containing identity data or other data of the remote station but omitting the portion transmitted by the reader or interrogator; calculating means for calculating a check sum or CRC from the field originally sent and the truncated reply data received, or calculated from the check sum or CRC from the truncated data alone and a comparator for comparing the calculated check sum or CRC with the check sum or CRC sent by the remote station.

Other method, system and transponder or tag features are defined in the appended claims.

DESCRIPTION OF AN EMBODIMENT OF THE INVENTION

The invention will be described further, by way of example, with reference to the accompanying drawings, in which:

FIG. 2 shows a flow diagram of the command response sequence;

Figure 1:
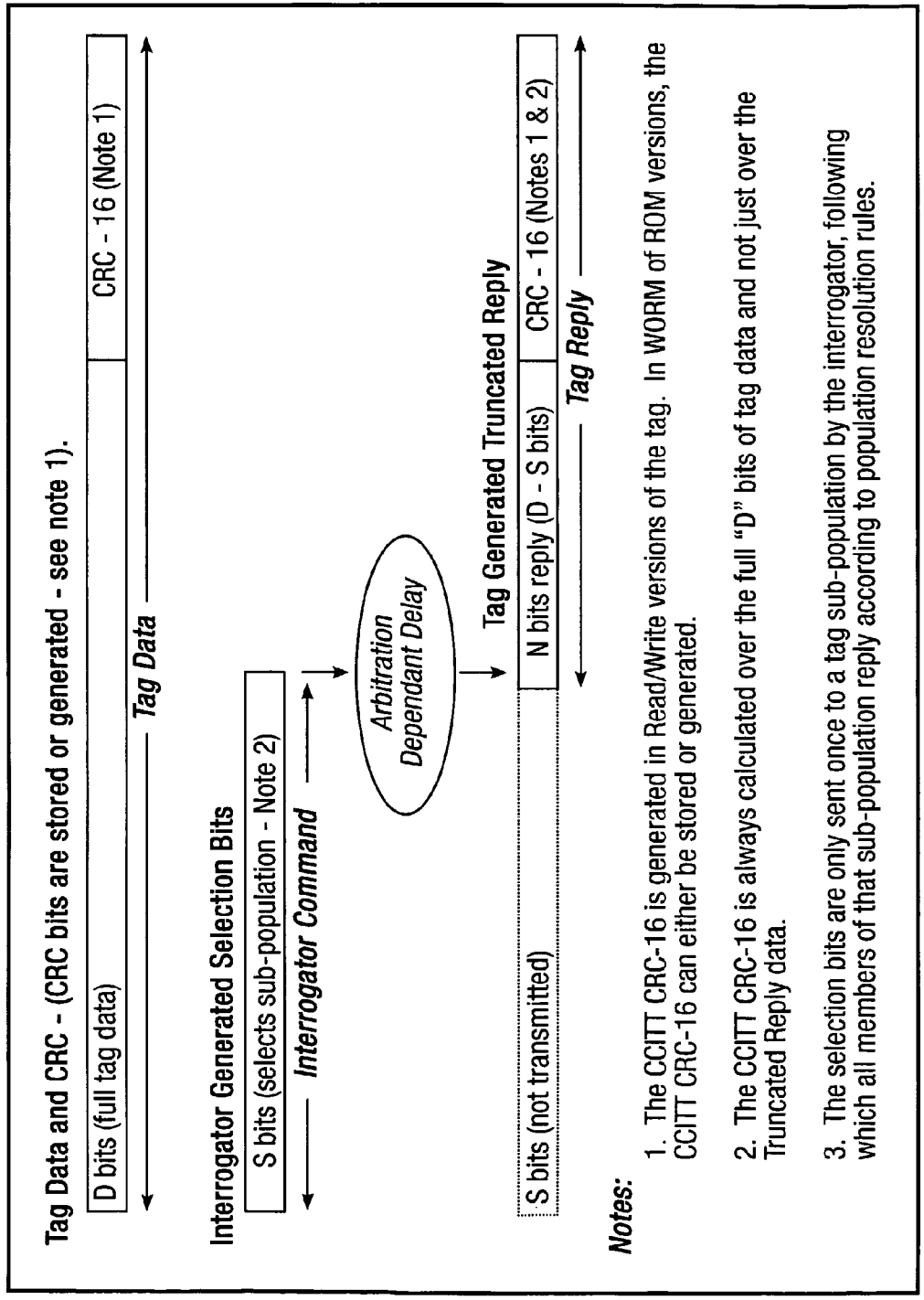
FIG. 1 illustrates a typical bit format for a tag identity and a portion of that bit identity used by an interrogator in its command to select a sub-population of tags.

A typical RFID system comprises a reader and a plurality of tags, the reader issues a request command containing a mask for all tags present within the reader's illuminating field to reply if for example the first 16 bits of the tag identity match the 16 bits in the mask field contained within the reader's request command. The tags whose 16 bits match, reply. If the system uses binary search or collision arbitration the tags will reply according to the accepted algorithm for their particular system as is well known in the art. The tag message (reply) will contain the tag's identity and the checksum which may either precede or be appended to the identity in the tag transmission. The order of identity and checksum within the tag transmitted message (reply) is unimportant, in other words it does not matter whether the checksum is transmitted before or after the identity/data.

The checksum will be calculated over the entire identity or stored data as the case may be. In one example, the tag transmitted message will be to exclude the first 16 bits of its identity but will contain the checksum as if the entire message had been transmitted.

Operation of the Reader

The reader clocks in the tag transmitted message.

When the reader sends the request to the tag it begins calculating the tag reply checksum in the example using the 16 bit, mask value contained in the request which will be compared by the tags, the value of this partial checksum calculation being temporarily saved for use with multiple tag replies.

As each tag replies, the tag message transmission is clocked into the reader and the reader continues calculating the checksum from that point onwards so that when the last bit of the tag message is clocked in the checksum computes correctly and therefore the reader knows that there was no error.

After having received the reply from the first tag, the reader resets the checksum calculation logic and pre-loads the partially calculated checksum saved earlier and then repeats the procedure above for each tag transmission received by it. An alternative method would have the reader recalculate the first portion of the checksum following successful reception and decoding of each tag transmission until such time as it re-issues a new request.

Operation of the Tag

In the case of tags which generate their checksum 'on the fly' as they clock out their identity or data. On receiving a request command from the reader to send a truncated reply, as the command data transmission is received from the reader, the data field in the command containing the mask will be clocked through the checksum generator on the tag. As the balance of the tag data is transmitted by the tag, this too is clocked through the checksum generator, and then finally the checksum is clocked out.

One particular embodiment will now be described. in which the system consists of an rfid reader and a plurality of tags. Each tag is identical to the next except for its unique identity which is stored in its memory. The operation is as follows.

Figure 4:
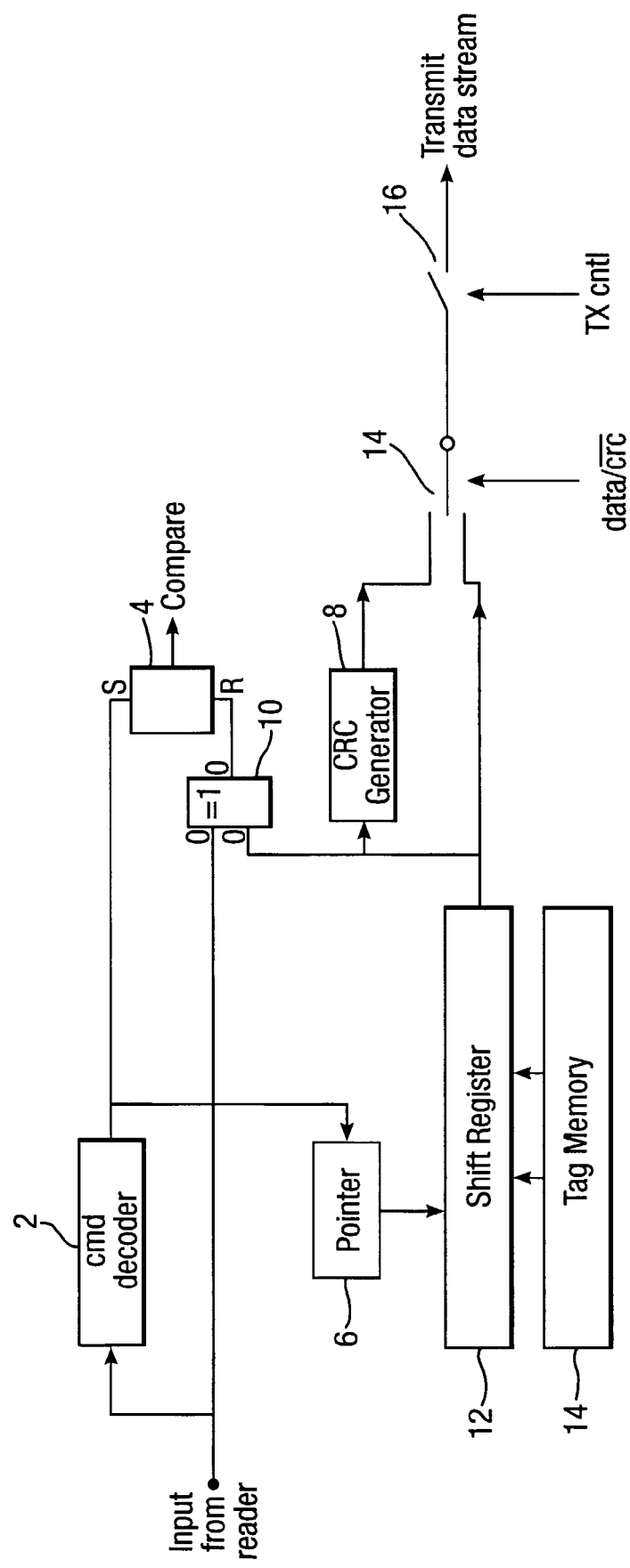
FIG. 4 is a block diagram of a typical tag in accordance with one embodiment of the invention.

The reader issues a select command or commands to the tags present in the reader's communication field. The select command has as one of its parameters, a mask value. This mask value represents a portion of the identification number of a family of tags, a number of which may be present. On receiving a command from the reader, all tags present decode the command in a command decoder 2, as show in FIG. 4.

If the command is a select command, the tags then compare the mask value contained in the command with the corresponding portion of their identity. This is done by shifting the data in the tag memory 14 through the tag transmit shift register 12 in sync with the incoming mask data and performing a bit by bit comparison between the two, via XOR Gate logic 10 and a comparator 4. If the tag data and the mask value match, then the tag sets a Compare OK or Select flag which serves to enable the tag to take part in the arbitration cycle which follows. When the tag is receiving the mask and performing the comparison with the internal data, it is also shifting this internal data through a CRC generator 8 on the tag, this being the same CRC generator 8 used to generate the tag CRC.

Once the Select flag has been set the tag stops shifting any further data through the transmit shift register 12 and also no further data is shifted through the CRC generator 8, however the CRC generator 8 freezes and retains its current state. A pointer 6 in the tag also marks the position where the comparison ended. When the tag participates in the arbitration sequence as determined by the arbitration algorithm implemented and by command from the reader (sending arbitration commands) it switches on its Transmitter (which may be an active transmitter or backscatter modulator depending on the hardware configuration), switch 16 is closed and switch 14 is connected to the output of the Transmit Shift Register 12, and begins to shift out the tag ID data, starting from bit position following the point where the comparison with the mask ended. At the same time that this data is shifted out to the modulator, it is also shifted through the CRC generator 8. The CRC generator 8 takes up where it previously stopped as if it had not been frozen and without resetting its value. When the last data bit has been shifted out, the tag switches, the switch 14 connecting to the output of the CRC generator. This changes the output line from the Transmit Shift Register 12 to the output of the CRC generator 8 and continues transmitting until all the CRC bits have been transmitted. When the last CRC bit has been transmitted the tag switches off the transmitter and returns to the standby state.

During this process the reader has been undertaking its own CRC check. The first part of the CRC check is generated from the mask value which the reader sent to the tags present as the mask parameter in the Select command. This interim CRC value so calculated is retained by the reader and is used to further calculate the expected CRC value for the incoming tag transmissions. As a tag transmission is received by the reader, the reader calculates the CRC on the incoming data stream using the previously retained CRC value as it starting point. Once the entire tag message has been received including the tag CRC, the reader calculated CRC is compared with the tag CRC and if they match then the reader knows that the message was correctly received.

FIG. 2 shows a flow diagram of operations in the tag upon receiving a command or selection instruction from the reader. As shown the tag is initially in a Standby state awaiting the receipt of a command from the reader. If the command is a "Select" command containing a mask data field the tag proceeds to compare the mask with "n" bits of its tag ID.

The tag clocks its TX shift register 12 together with the incoming mask data and performs a bit by bit comparison of the tag and the mask for "n" bits as determined by the mask length. Simultaneously the ID is shifted through the tag CRC Generator 8. At this time the reader calculates the first portion of the CRC based on the mask value transmitted to the tag in the select command.

Referring to steps shown in FIG. 2, if the mask and "n" bits of the tag ID match, the tag sets its Selected flag and waits for its turn to transmit as determined by the system arbitration algorithm. The pointer 6 indicates the position of the next bit in the tag memory following the last bit compared. The CRC generator 8 retains its current value.

When it is the tag's turn to transmit, it starts its transmission from the bit position indicated by the pointer 6. The ID is simultaneously shifted through the CRC generator, the CRC generator continues from its last position without resetting. At the same time as the reader receives the tag transmission, it continues from where it left off, calculating the CRC on the incoming message.

As can be seen in the flow diagram of FIG. 2, when the last ID bit is shifted out of the tag memory, the tag switches to shifting out the CRC bits. When the last CRC bit has been shifted out the TX switches off completing the reply cycle. The CRC is calculated over the complete ID stored in memory 14 even though only a portion of the ID was actually transmitted. Contemporaneously, once the reader has received the last message bit from the tag it compares the CRC transmitted by the tag with the CRC generated in the reader from the mask value transmitted by it and the data stream received from the tag.

As shown in FIG. 2 there are several instances in the flow diagram when the tag will revert to its Standby state, these being when the command received is not found to be a "Select" command, when the mask bits do not match up to the bits in the tag ID and when the reply cycle of the tag has been completed.

Figure 3:
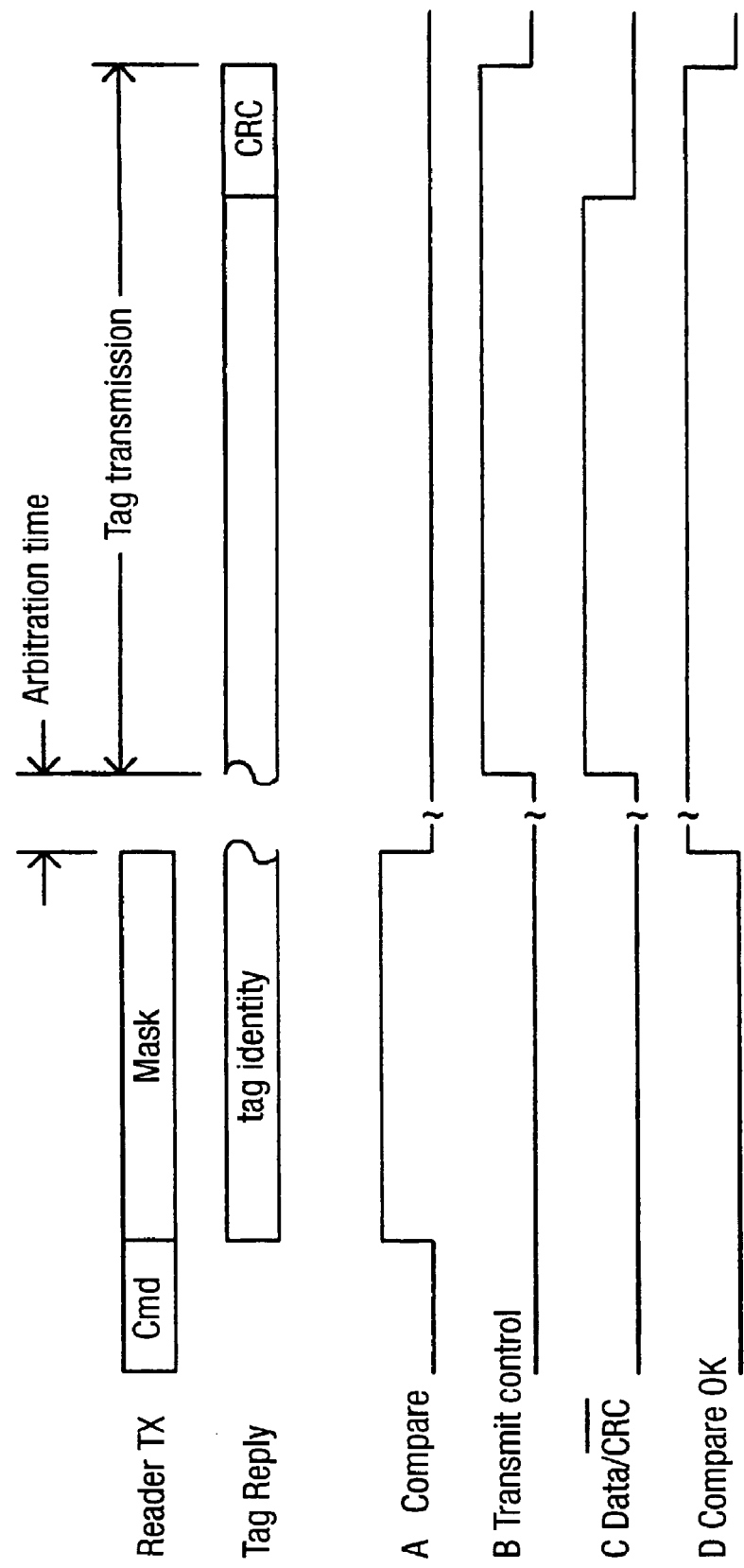
FIG. 3 shows the relative internal timing in the tag of the incoming command, the compare sequence and the transmitted tag message, together with the internal timing signals A, B, C and D

FIG. 3 shows the relative internal timing in the tag of the incoming command, the compare sequence and the transmitted tag message, together with the internal timing signals A, B, C and D.

This system and method may also be used in the reverse situation where a base station transmits a truncated message, the remote station then calculating a CRC or checksum based on a known portion of the base station command or message which is not sent.

It will be appreciated that this is just one of many possible embodiments of this method.

For example, in the embodiment described above, the CRC is calculated on the tag over the full stored data (message) even though a truncated message is transmitted. In this case the reader calculates the CRC on that portion of the data sent as the selection criterion combined with that portion of the data in the tag reply. The selection mask is described above as corresponding to a sequence of bits from the START of data in the relevant tag data field. In alternative embodiments the selection mask data may be from the MIDDLE of data in the tag or END of data in the tag. In other words the selection does not necessarily need to start at the most significant bit of the tag stored data. It may also refer to several unconnected fields with the tag data memory.

In another implementation, the tag contains a stored CRC calculated over the full data message which message is then truncated when it is sent. The reader calculates the crc on that portion of the data sent as the select criterion [mask] combined with that portion of the data sent by the tag. Selection mask may be from START of data in tag, MIDDLE of data in tag or END of data in tag. As described above the selection does not necessarily need to start at the most significant bit of the tag stored data.

In a further implementation, the tag may contain multiple stored CRCs for multiple data fields, each data field having its own CRC. In this case truncation may occur on boundaries, each boundary associated with one stored CRC (plus one for the full tag data). Selection of the CRC and determination of the boundaries can be done on the tag or by a specific reader command or instruction to the tag. Selection may be equal to the field size of each data field or may be longer covering multiple data fields.

In yet a further embodiment the CRC is based on the transmitted [truncated] portion of the tag message, this is used when the reader calculates and uses only that portion of the data sent by the tag ignoring the unsent part.

It will be appreciated by the skilled person in the art that the invention is not restricted to the above embodiments, for example the arbitration protocols, and the operating parameters associated with modulation and frequency may be modified.

By way of illustration the invention may make use of the frequency and modulation parameters as exemplified in RFID International Standard, ISO/IEC 18000-6, first edition, published on 15 Aug. 2004, with appropriate modification of the arbitration techniques, for both Type A (ALOHA) and Type B (binary tree search). This will be readily appreciated by those persons skilled in the art.

The invention claimed is:

1. A method of calculating and verifying the integrity of data in a data communication system comprising a base station and one or more remote stations, the method including;

transmitting one or more select instructions from the base station to said one or more remote stations, the select instruction or instructions containing a data field which matches a portion of an identity or other data field in one or more of the remote stations;

communicating from a selected remote station or stations a truncated reply containing identity data or other data of the remote station but omitting the portion transmitted by the base station; and calculating in the base station a check sum or CRC from the data field originally sent and the truncated reply data received and comparing the calculated check sum or CRC with the check sum or CRC sent by the remote station.

2. A method as claimed in claim 1, wherein the base station is a reader or interrogator and the remote station or stations are RFD transponders.

3. A method as claimed in claim 2, including sending a command from the reader to a remote station command decoder for decoding the command, shifting data in a remote station memory to a remote station shift register in synchronism with incoming mask data from the reader to a comparator, performing a bit by bit comparison between the mask data and the remote station memory data at the comparator, and calculating a checksum or CRC at a checksum or CRC generator within the remote station.

4. A method as claimed in claim 3, including presenting the input data from the reader and the output from the remote station shift register to respective inputs of a logic circuit.

5. A method as claimed in claim 3, wherein when the remote station is receiving the mask and performing the comparison with the internal memory data, it is also shifting the internal data through the checksum or CRC generator, this being the same CRC generator of generators used to generate the remote station CRC.

6. A method as claimed in claim 1, wherein the remote station transmits its check sum or CRC as data either preceding or appended to its identity or other data in its truncated reply.

7. A method as claimed in claim 1, wherein in response to a select instruction from the base station the remote station clocks data corresponding to that in the select instruction through a checksum generator, the data in the truncated reply also being clocked through the checksum generator to derive a checksum which is clocked out appended to the truncated reply data.

8. A method as claimed in claim 1, wherein the base station begins calculating the anticipated checksum or CRC of the remote station or stations during a period preceding the receipt of the truncated reply, to derive a partial checksum calculation based on the data field in the select information, the partial checksum calculation being temporarily saved for use when the truncated reply is received.

9. A method as claimed in claim 8, wherein the base station begins calculating the partial checksum during the transmission of the select information.

10. A method as claimed in claim 8, wherein the truncated reply from the remote station is clocked through a checksum generator to continue calculating the checksum, beginning from the saved partial checksum, whereby upon receiving the last bit from the truncated reply, the final checksum calculated in the base station can be compared with that sent by the remote station.

11. A method as claimed in claim 10, wherein having received the truncated reply from a remote station, the base station resets the checksum calculation logic and pre-loads the partially calculated checksum previously saved, ready to receive the truncated reply from another selected remote station.

12. A method as claimed in claim 10, wherein having received the truncated reply from a remote station, the base station recalculates the data in the select information following successful reception and decoding of each truncated reply, for calculating together with the data in the truncated reply to derive the checksum or CRC, and continuing this process until the base station transmits a new select information request to the remote stations.

13. A method as claimed in claim 1, including setting within the remote station a Compare OK or Select flag, which serves to enable the remote station to take part in an arbitration cycle, when the remote station data and the mask value match.

14. A method as claimed in claim 13, wherein once the Select flag has been set the remote station stops shifting any further data through the transmit shift register and also no further data is shifted through the CRC generator, the CRC generator freezing and retaining its current state.

15. A method as claimed in claim 14, wherein a pointer in the remote station marks the position where the comparison ended, and the remote station participating in the arbitration sequence as determined by the arbitration algorithm implemented, and by command from the reader (sending arbitration commands), switches on its Transmitter, and begins to shift out the remote station ID data, starting from bit position following the point where the comparison with the mask ended.

16. A method as claimed in claim 1, wherein the calculation in the base station of a check sum or CRC may be based from the same section or sections of the full data message used by the remote station to calculate the CRC sent with the data transmitted, this being the data field originally sent, and the truncated reply data received and comparing the calculated check sum or CRC with the check sum or CRC sent by the remote station.

17. A system for calculating and verifying the integrity of data in a data communication system comprising a base station and one or more tags, the system comprising:
transmitting means for transmitting select instructions from the base station to said one or more tags, the select instruction containing a data field which matches a portion of an identity or other data field in one or more of the tags;
transmitting means for transmitting from a selected tag or stations a truncated reply containing identity data or other data of the tag but omitting the portion transmitted by the base station; and
calculating means for calculating in the base station a check sum or CRC from the data field originally sent and the truncated reply data received; and
a comparator for comparing the calculated check sum or CRC with the check sum or CRC sent by the tag.

18. A system as claimed in claim 17, wherein the base station is a reader or interrogator and the tag or stations are RFID transponders.

19. A system as claimed in claim 18, wherein each tag comprises a command decoder for decoding the command from the reader, a shift register for shifting data in a tag memory in synchronism with incoming mask data from the reader to a comparator, the comparator performing a bit by bit comparison between the mask data and the tag memory data, and a checksum or CRC generator.

20. A system as claimed in claim 19, wherein the input data from the reader and the output from the shift register are presented to respective inputs a Logic Gate.

21. A system as claimed in claim 19, wherein when the tag data and the mask value match, the tag sets a Compare OK or Select flag which serves to enable the tag to take part in an arbitration cycle.

22. A system as claimed in claim 21, wherein once the Select flag has been set the tag stops shifting any further data through the transmit shift register and also no further data is shifted through the CRC generator, the CRC generator being controlled to freeze and retain its current state.

23. A system as claimed in claim 22, wherein a pointer in the tag marks the position where the comparison ended, and the tag participates in the arbitration sequence as determined by the arbitration algorithm implemented, and by command from the reader (sending arbitration commands), it switches on its Transmitter, and begins to shift out the tag ID data, starting from bit position following the point where the comparison with the mask ended.

24. A system as claimed in claim 23, wherein at the same time as the tag ID data is shifted out to the modulator, it is also shifted through the CRC generator, the CRC generator taking up where it previously stopped as if it had not been frozen and without resetting its value.

25. A system as claimed in claim 24, wherein when the last data bit has been shifted out, a switch within the tag switches to the output of the CRC generator which continues transmitting until all the CRC bits have been transmitted.

26. A system as claimed in claim 25, wherein when the last CRC bit has been transmitted a further switch in the tag switches off the transmitter and returns the tag to the standby state.

27. A system as claimed in claim 19, wherein means are provided whereby when the tag is receiving the mask and performing the comparison with the internal memory data, it is also shifting the internal data through the checksum or CRC generator, this being the same CRC generator used to generate the tag CRC.

28. A transponder or tag for use in an RFID system with a reader or interrogator, comprising:
   a command decoder configured to decode a command from the reader,
   a shift register configured to shift data in the tag memory in synchronism with incoming mask data from the reader to a comparator, the comparator configured to perform a bit by bit comparison between the mask data and the tag memory data, wherein the data in the tag memory is internal data of the tag, and
   a checksum or CRC generator configured to generate a checksum or CRC of the data in the tag memory, wherein the shift register is further configured to shift data in the tag memory to the checksum or CRC generator.

29. A transponder or tag as claimed in claim 28, wherein the input data from the reader and the output from the shift register are presented to respective inputs a logic gate.

30. A transponder or tag as claimed in claim 28, wherein when the tag data and the mask value match, the tag sets a Compare OK or Select flag which serves to enable the tag to take part in an arbitration cycle.

31. A transponder or tag as claimed in claim 30, wherein once the Select flag has been set the tag stops shifting any further data through the transmit shift register and also no further data is shifted through the CRC generator, the CRC generator being controlled to freeze and retain its current state.

32. A transponder or tag as claimed in claim 31, wherein a pointer in the tag marks the position where the comparison ended, and the tag participates in the arbitration sequence as determined by the arbitration algorithm implemented, and by command from the reader (sending arbitration commands), it switches on its Transmitter, and begins to shift out the tag ID data, starting from bit position following the point where the comparison with the mask ended.

33. A transponder or tag as claimed in claim 32, wherein at the same time as the tag ID data is shifted out to the modulator, it is also shifted through the CRC generator, the CRC generator taking up where it previously stopped as if it had not been frozen and without resetting its value.

34. A transponder or tag as claimed in claim 33, wherein when the last data bit has been shifted out, a switch within the tag switches to the output of the CRC generator which continues transmitting until all the CRC bits have been transmitted.

35. A transponder or tag as claimed in claim 33, wherein when the last CRC bit has been transmitted a further switch in the tag switches off the transmitter and returns the tag to the standby state.

36. A transponder or tag as claimed in claim 28, wherein means are provided whereby when the tag is receiving the mask and performing the comparison with the internal memory data, it is also shifting the internal data through the checksum or CRC generator, this being the same CRC generator used to generate the tag CRC.

37. A transponder or tag as claimed in claim 28, wherein means are provided whereby when the tag is receiving the mask and performing the comparison with the internal memory data, it is also shifting the internal data through the checksum or CRC generator, this being a second CRC generator similar to that used to generate the tag CRC.

38. A method of calculating and verifying the integrity of data in a data communication system comprising a base station and one or more remote stations, the method including:
   transmitting a select instruction from the base station to said one or more remote stations, the select instruction containing a data field which matches a portion of an identity or other data field in one or more of the remote stations;
   communicating from a selected remote station or stations a truncated reply containing identity data or other data of the remote station but omitting the portion transmitted by the base station; and
   calculating in the base station a check sum or CRC from the data the truncated reply data received and comparing the calculated check sum or CRC with the check sum or CRC sent by the remote station.

39. A method as claimed in claim 38, wherein the CRC is based on the transmitted portion of the remote station message, the reader calculating and using only that portion of the data sent by the remote station ignoring the unsent part.

40. A method of calculating and verifying the integrity of data in a data communication system comprising one or more base stations and one or more remote stations, the method including:
   transmitting a select instruction from the remote station to said one or more remote base stations, the select instruction containing a data field which matches a portion of an identity or other data field in one or more of the remote base stations;
   transmitting from a selected bases station or stations a truncated reply containing identity data or other data of the base station but omitting the portion transmitted by the remote station;
   calculating in the remote station a check sum or CRC from the data the truncated reply data received; and
   comparing the calculated check sum or CRC with the check sum or CRC sent by the remote station.

41. A reader or interrogator for use in a system with one or more remote stations, the reader including:
   a transmitter arranged to transmit one or more select instructions to said one or more remote stations, the select instruction or instructions containing a data field which matches a portion of an identity or other data field in one or more of the remote stations;
   a receiver arranged to receive a truncated reply containing identity data or other data of the remote station but omitting the portion transmitted by the reader or interrogator;

calculating means for calculating a check sum or CRC from the field originally sent and the truncated reply data received, or calculated from the check sum or CRC from the truncated data alone; and a comparator for comparing the calculated check sum or CRC with the check sum or CRC sent by the remote station.

* * * * *

UNITED STATES PATENT AND TRADEMARK OFFICE
CERTIFICATE OF CORRECTION

Page 1 of 1

PATENT NO.        : 7,987,405 B2
APPLICATION NO.   : 10/597194
DATED             : July 26, 2011
INVENTOR(S)       : Turner et al.

It is certified that error appears in the above-identified patent and that said Letters Patent is hereby corrected as shown below:

Column 9,
Line 6, "RFD" should read --RFID--.

Signed and Sealed this
Thirteenth Day of March, 2012

David J. Kappos
*Director of the United States Patent and Trademark Office*